(12) United States Patent
Feldbaum et al.

(10) Patent No.: US 7,075,094 B2
(45) Date of Patent: Jul. 11, 2006

(54) SYSTEM, METHOD, AND APPARATUS FOR ION BEAM ETCHING PROCESS STABILITY USING A REFERENCE FOR TIME SCALING SUBSEQUENT STEPS

(75) Inventors: Michael Feldbaum, San Jose, CA (US); Hung-Chin Guthrie, Saratoga, CA (US); Wipul Pemsiri Jayasekara, Los Gatos, CA (US); Aron Pentek, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 102 days.

(21) Appl. No.: 10/930,277

(22) Filed: Aug. 30, 2004

(65) Prior Publication Data
US 2006/0043280 A1    Mar. 2, 2006

(51) Int. Cl.
*H01J 37/305* (2006.01)
(52) U.S. Cl. .............. 250/492.2; 250/492.21; 250/492.3; 438/473
(58) Field of Classification Search ............... None
See application file for complete search history.

(56) References Cited

U.S. PATENT DOCUMENTS

| | | | | |
|---|---|---|---|---|
| 4,874,947 | A * | 10/1989 | Ward et al. | 250/309 |
| 6,268,608 | B1 * | 7/2001 | Chandler | 250/492.2 |
| 2006/0022148 | A1 * | 2/2006 | Fischione et al. | 250/492.21 |

* cited by examiner

*Primary Examiner*—Nikita Wells
(74) *Attorney, Agent, or Firm*—Bracewell & Giuliani LLP

(57) ABSTRACT

A system for improving drift compensation for ion mill applications defines a reference step for purposes of time duration. The reference step is controlled by an end point detector and monitored for use with subsequent process steps. The time duration for a subsequent step is adjusted as a percentage of the reference step. A time scaling factor determines the actual duration of the subsequent step. Rather than directly using times of step duration, the system uses a percentage of the reference step for the latter step. The duration of the reference step varies depending on the tool drift. The overall duration is changed in the same proportion as the duration of the reference step, and thereby compensates for the influence of drift on the end product.

13 Claims, 3 Drawing Sheets

SYSTEM, METHOD, AND APPARATUS FOR ION BEAM ETCHING PROCESS STABILITY USING A REFERENCE FOR TIME SCALING SUBSEQUENT STEPS

BACKGROUND OF THE INVENTION

1. Technical Field

The present invention relates in general to improved processing for ion beam etching and, in particular, to an improved system, method, and apparatus for improving the process stability of ion beam etching by using a step reference for time scaling of subsequent steps of the process.

2. Description of the Related Art

Ion milling is used in integrated circuit and thin film component fabrication to remove coatings either partially or completely from the component at various steps of the fabrication process. A coating is removed from a substrate, such as a semiconductor wafer, by being placed in a vacuum chamber in which a gas is ionized to generate reactive ions. The removal of the coating is achieved by a chemical reaction between the ions and the coating, as well as by bombardment of the coating by the ions. The gaseous reaction products are continuously removed from the chamber by a vacuum pump. The terms ion milling, ion etching, and plasma etching all relate to the same general process and may be used interchangeably. However, in some applications, there is no chemical reaction involved in the process when Nobel gases are used for ion mill.

Ion milling applications are subject to run-to-run process variation due to several factors. For example, tool drift or workpiece drift (e.g., from wafer to wafer) due to heating, deformation, material density, layer resistance, charging, thickness, etc., can cause variations. The approach currently used to solve such drift problems is to adjust a suitable process variable based on observations and measurements from previous runs (i.e., trial and error). For example, a secondary ion mass spectrometer end point detector (SIMS EPD) may be used to control the milling depth in some applications. It can be used to start milling or stop milling when a pre-determined layer has been reached. The duration depends solely on the milling rate, which fluctuates based on the conditions of the tool when a sample is processing.

As shown in FIG. 1, an ion mill process includes a workpiece or substrate 21, such as alumina, a sensor structure 23, a mask 25, and an ion beam 27. During the ion mill process, the time durations of the first step 11 and the third step 15 are controlled by a SIMS EPD. The time durations of the second step 13 and fourth step 17 are calculated using the mill rate (i.e., E_rate). The mill rate is only monitored periodically, typically about every 48 hours. Each time the mill rate changes, the time durations for the second and fourth steps 13, 17 are corrected accordingly.

One problem with this approach is the delay (i.e., as much as 48 hours) between the time that the measurements are taken and the actual implementation of the changes to the tools. During this delay, the tool conditions continue to drift such that, by the time the changes are made, additional changes are needed to compensate for the additional drift that has been incurred during the time delay. Thus, an improved and more timely system for compensating for drift would be very desirable.

SUMMARY OF THE INVENTION

One embodiment of a system, method, and apparatus for improving drift compensation for ion mill applications is disclosed. The time duration of just one of the steps, controlled by an end point detector (EPD) and monitored with instruments such as an optical emission spectrometer (OES), an interferometer, or a secondary ion mass spectrometer (SIMS), is used as a "reference step" for the other process steps. A parameter (e.g., the time duration) for each subsequent step in the process is adjusted as a percentage of the reference step. In one embodiment, the software for the tooling uses a time scaling factor utilizing the actual time used in the step controlled by the EPD to determine the duration of each of the other steps of the process. Rather than directly using times of step duration in a recipe editor currently used in the tools, this system uses a percentage of the reference step collected by the tool (e.g., in data log, for example) for each step that follows it.

The time duration of the reference step varies depending on the tool drift. When the subsequent steps use the time duration of the reference step, the overall time duration is changed in the same proportion as the time duration of the reference step, and thereby compensates for the influence of tool drift on the end product.

In one example, a type of ion milling process prescribes the reference step as mill with stop on Cu line. The time duration for every other step is chosen as a percentage of the reference, e.g., 50% for steps with a 70° angle, 100% for steps with a 0° angle, etc. For another type of milling process, the reference step is mill with a 10° incident angle with stop on Mo. The 70° step has a fixed 65% duration of the first step. For perpendicular pole lamination, the pole tip is a laminated material, such as CoFe with NiCr spacers. The first mill is controlled with EPD, and uses its duration as the reference step for calibration of milling the rest of the P3 pole.

The present invention has several advantages, including precise adjustment of milling for specific products in real time. Any drift incurred by the tool or other processes are compensated, temperature-charging incurred drift is eliminated. In addition, the profile has tighter control based on actual layer thickness.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Figure 1:
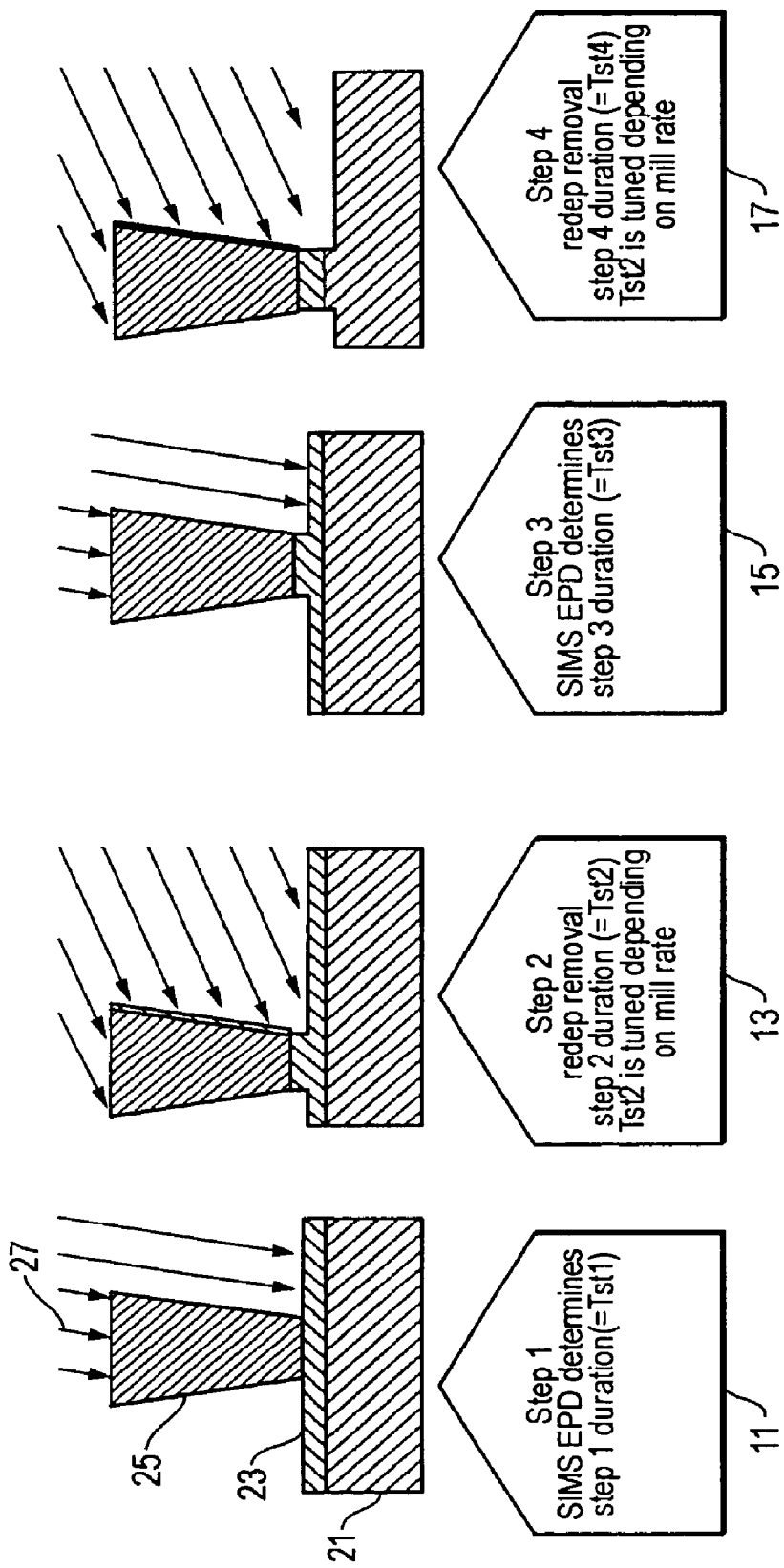
FIG. 1 is a series of schematic diagrams of a conventional ion milling process.
Figure 2:
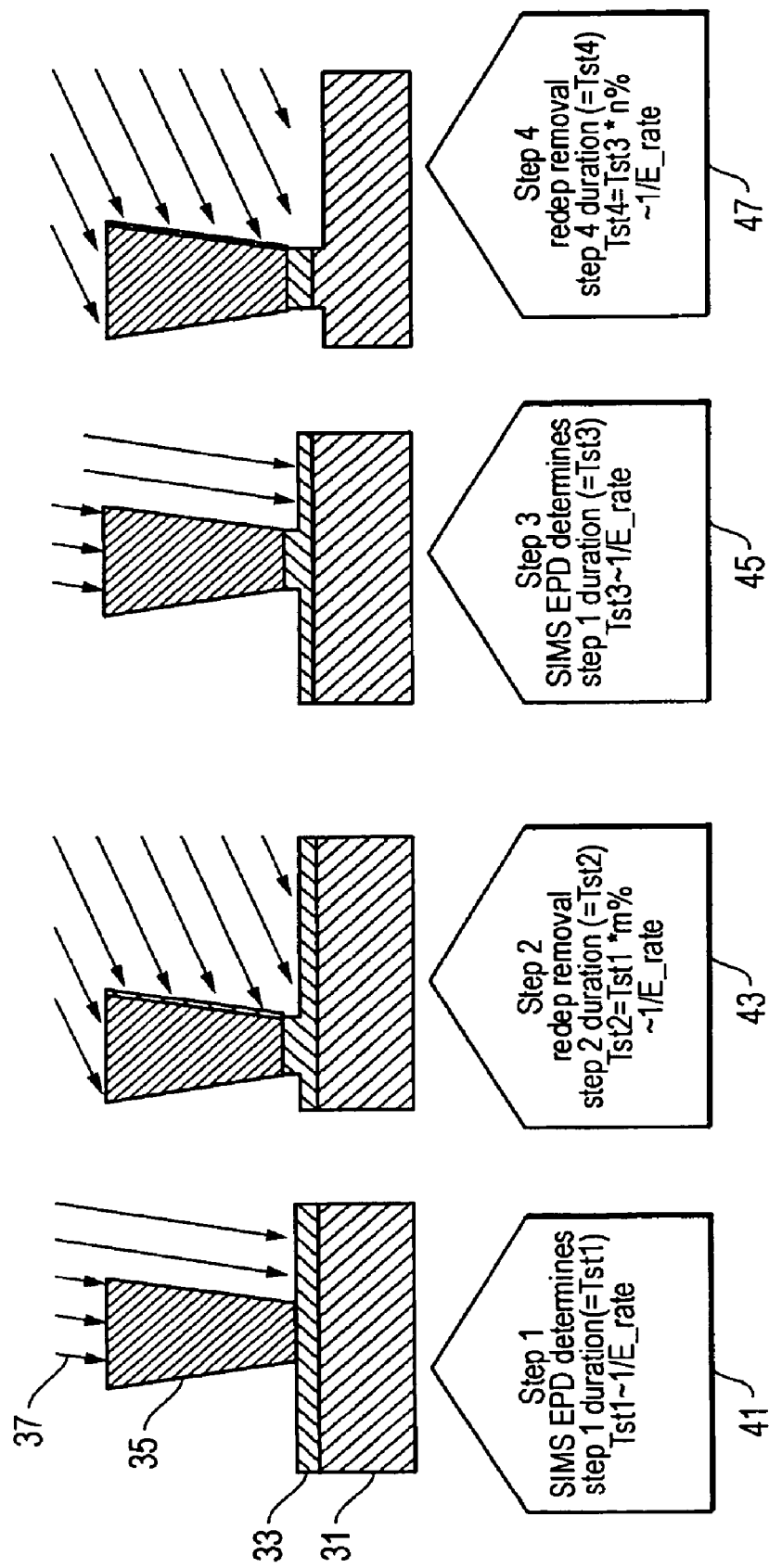
FIG. 2 is a series of schematic diagrams of one embodiment of a process constructed in accordance with the present invention.

Referring to FIG. 2, one embodiment of a system, method, and apparatus for improving control of a process is disclosed. The present invention is well suited for improving drift compensation for ion milling processes. In one embodiment, a method of the present invention initially comprises ion milling a workpiece or substrate 31 having a sensor structure 33 with a mask 35 and an ion beam 37.

During the ion mill process, a parameter (such as time duration) of at least one of the steps of the process is detected and monitored. In one embodiment, it is the first step 41 of the process that is monitored. For example, the first step 41 may be performed by using an artificially deposited precursor. The precursor has the exclusive purpose of being milled to obtain a reference time for the remaining steps of the ensuing process. The time duration of the reference step is scaled for subsequent steps in order to improve process control. The time duration of the first step 41 is monitored.

In an alternate embodiment, the time durations of the first and third steps 41, 45 may be controlled with a secondary ion mass spectrometer end point detector. Other instruments for these purposes may include monitoring the ion milling process with an optical emission spectrometer or an interferometer.

As a result of the actual time duration of the first step 41, a time duration of the second step 43 in the ion milling process is adjusted in-situ. A similar step is performed for the actual time duration of the third step 45, such that the time duration of the fourth step 47 is adjusted in-situ. These adjustment steps may comprise adjusting the time durations for the second and fourth steps 43, 47, respectively, as a percentage of the time durations of the first and third steps 41, 45, such that the time durations of the second and fourth steps 43, 47 are changed in a same proportion as the time durations of the first and third steps 41, 45. In this way an influence of drift (e.g., tool and/or workpiece drift) on an end product is compensated.

However, in another embodiment, only one step (e.g., the first step) is used as a reference for all subsequent steps to further simplify the present invention. For example, when the first step is used as a reference for the rest of the process, all steps following the first step are scaled as a percentage of the first step, which is controlled by EPD. The second, third, and fourth steps 43, 45, 47 are performed.

As an example, the step used as the reference step is mill with stop on Cu or Cr line. The duration for each next step is chosen as a percentage of the reference (e.g., 50% for steps with a 70° angle, 100% for steps with a 0° angle, etc.). For partial milling process, the reference step is mill with a 10° incident angle with stop on Mo. The 70° step has a fixed 65% duration of the first step. For perpendicular pole lamination, the pole tip is a laminated material, such as CoFe with NiCr spacers. The first mill (e.g., 10° step) is controlled with EPD catching up Cr line, and uses its duration as the reference step for calibration of milling the rest of the P3 pole.

Figure 3:
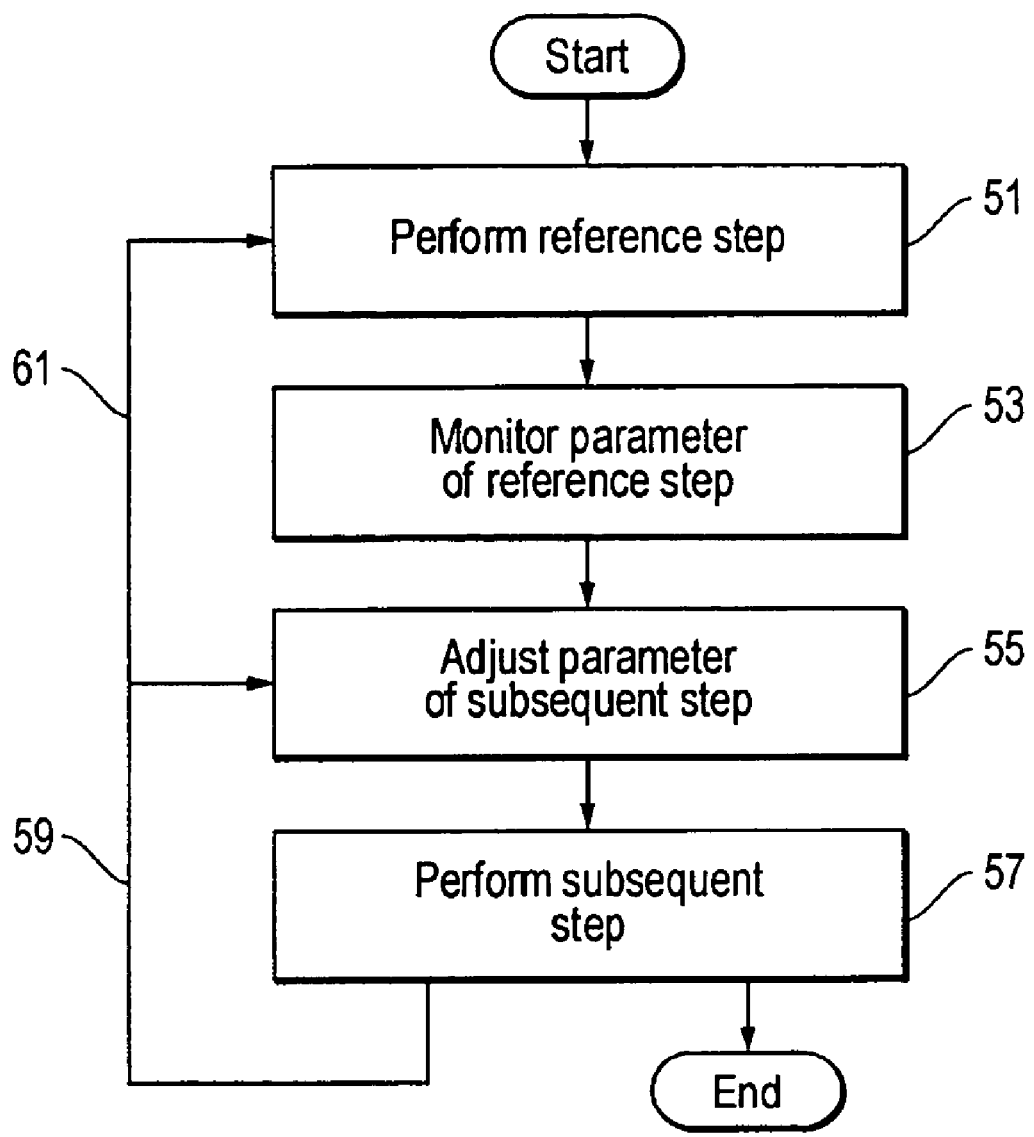
FIG. 3 is a flowchart of the process of FIG. 2.

In another embodiment (FIG. 3), the present invention improves the process control in ion mill processing to compensate for an influence of tool drift on an end product. This embodiment initially comprises performing a reference step (e.g., first step), as illustrated at block 51, in an ion milling process by using an artificially deposited precursor with the exclusive purpose of being milled to obtain a reference time for scaling a time duration of a subsequent step n of the ion milling process that follows the first step. A time duration of the first step is monitored (block 53) with an end point detector.

The time duration of the subsequent step n in the ion milling process is adjusted (block 55), in-situ, in response to the previous step as a percentage of the time duration of the first step, such that the time duration of the subsequent step n is changed in a same proportion as the time duration of the first step. The subsequent step n is performed (block 57) in accordance with the previous step and thereby improving tool drift compensation for the ion milling process. As indicated at arrow 59, the parameters of additional subsequent steps may be adjusted in performed in a similar manner. Finally, as indicated at arrow 61, an additional interim reference step(s) may be performed and monitored for their respective parameters to further compensate for drift.

While the invention has been shown or described in only some of its forms, it should be apparent to those skilled in the art that it is not so limited, but is susceptible to various changes without departing from the scope of the invention.

What is claimed is:

1. A method of improving control of a process, comprising:
    (a) performing a step in a process and designating said step as a reference step;
    (b) monitoring a time duration of the reference step;
    (c) adjusting a time duration of a next step in the process that follows the reference step, in-situ, in response to step (b), as a percentage of the time duration of the reference step, such that the time duration of the next step and subsequent steps that follow the next step are changed in a same proportion as the time duration of the reference step;
    (d) performing the next step and the subsequent steps of the process in accordance with step (c).

2. The method of claim 1, further comprising improving tool drift compensation for the process in response to steps (a) through (d).

3. The method of claim 1, further comprising controlling the time duration of the reference step with a secondary ion mass spectrometer end point detector.

4. The method of claim 1, wherein step (a) comprises using an artificially deposited precursor with the exclusive purpose of being milled in step (a) to obtain a reference time for scaling the time duration of the next step in order to improve process control.

5. The method of claim 1, wherein step (b) comprises monitoring the process with an instrument selected from the group consisting of an optical emission spectrometer, an interferometer, and a secondary ion mass spectrometer.

6. The method of claim 1, wherein step (a) comprises designating a first step in the process as the reference step.

7. A method of improving process control in ion mill processing, comprising:
    (a) performing a first step in an ion milling process;
    (b) monitoring a time duration of the first step;
    (c) adjusting a time duration of a second step in the ion milling process, in-situ, in response to step (b);
    (d) performing the second step in accordance with step (c);
    (e) performing a third step in the ion milling process;
    (f) monitoring a time duration of the third step;
    (g) adjusting a time duration of a fourth step in the ion milling process, in-situ, in response to step (f); and then
    (h) performing the fourth step in accordance with step (g).

8. The method of claim 7, further comprising improving tool drift compensation for the ion milling process in response to steps (a) through (h).

9. The method of claim 7, further comprising controlling the time durations of the first and third steps with a secondary ion mass spectrometer end point detector.

10. The method of claim 7, wherein step (a) comprises using an artificially deposited precursor with the exclusive purpose of being milled in step (a) to obtain a reference time for scaling the time duration of the second step in order to improve process control.

11. The method of claim 7, wherein steps (b) and (f) comprise monitoring the ion milling process with an instrument selected from the group consisting of an optical emission spectrometer, an interferometer, and a secondary ion mass spectrometer.

12. The method of claim 7, wherein steps (c) and (g) comprise adjusting the time durations for the second and fourth steps, respectively, as a percentage of the time durations of the first and third steps, such that the time durations of the second and fourth steps are changed in a same proportion as the time durations of the first and third steps, and thereby compensate for an influence of tool drift on an end product.

13. A method of improving process control in ion mill processing to compensate for an influence of tool drift on an end product, comprising:

(a) performing a first step in an ion milling process by using an artificially deposited precursor with the exclusive purpose of being milled to obtain a reference time for scaling a time duration of a subsequent step n of the ion milling process that follows the first step;

(b) monitoring a time duration of the first step with an end point detector;

(c) adjusting the time duration of the subsequent step n in the ion milling process, in-situ, in response to step (b) as a percentage of the time duration of the first step, such that the time duration of the subsequent step n is changed in a same proportion as the time duration of the first step;

(d) performing the subsequent step n in accordance with step (c) and thereby improving tool drift compensation for the ion milling process.

* * * * *